(12) United States Patent
Van'tZelfde et al.

(10) Patent No.: US 10,124,823 B2
(45) Date of Patent: Nov. 13, 2018

(54) SYSTEMS AND METHODS FOR SHIELDING A HAND SENSOR SYSTEM IN A STEERING WHEEL

(71) Applicant: TK Holdings Inc., Auburn Hills, MI (US)

(72) Inventors: Dwayne Van'tZelfde, Holly, MI (US); Phillip Bernard Maguire, Bloomfield, MI (US); Justin Richard McCurdy, Howell, MI (US)

(73) Assignee: Joyson Safety Systems Acquisition LLC, Auburn Hills, MI (US)

( * ) Notice: Subject to any disclaimer, the term of this patent is extended or adjusted under 35 U.S.C. 154(b) by 461 days.

(21) Appl. No.: 14/719,480

(22) Filed: May 22, 2015

(65) Prior Publication Data

US 2015/0336601 A1 Nov. 26, 2015

Related U.S. Application Data

(60) Provisional application No. 62/001,968, filed on May 22, 2014.

(51) Int. Cl.
*B62D 1/06* (2006.01)
*H05K 9/00* (2006.01)
(Continued)

(52) U.S. Cl.
CPC ............... *B62D 1/06* (2013.01); *B62D 1/046* (2013.01); *B62D 1/065* (2013.01); *H03K 17/962* (2013.01);
(Continued)

(58) Field of Classification Search
CPC ...... B62D 1/046; B62D 1/065; B60N 2/5678; B60N 2/5685; B60R 21/01532; H05B 1/02; H05B 3/34
(Continued)

(56) References Cited

U.S. PATENT DOCUMENTS 3,585,626 A 6/1971 Tartarini
4,484,026 A 11/1984 Thornburg
(Continued)

FOREIGN PATENT DOCUMENTS

CN 1988055 A 6/2007
CN 201371849 Y 12/2009
(Continued)

OTHER PUBLICATIONS

Final Office Action issued in U.S. Appl. No. 14/728,366, dated May 25, 2017.
(Continued)

*Primary Examiner* — Dana Ross
*Assistant Examiner* — Joe E Mills, Jr.
(74) *Attorney, Agent, or Firm* — Meunier Carlin & Curfman LLC

(57) ABSTRACT

Systems and methods of shielding a hand sensor system in a steering wheel are disclosed herein. An exemplary hand sensor system includes a sensor mat and a heater mat that is disposed between the sensor mat and a frame of the steering wheel. A power source selectively provides a heating current to the heater mat to provide heat to the steering wheel and a shielding voltage signal to the heater mat to provide electrical shielding for the sensor mat when heating is not needed or when sensing takes priority over heating. Alternatively, the system may include a shield mat that is separate from the heater mat and is disposed between the sensor mat and the heater mat. In addition, to isolate the signal carried by individual sensor return wires, a metallic or insulating covering or conduit may be provided around the wires or portions thereof.

33 Claims, 9 Drawing Sheets

(51) Int. Cl.
*B62D 1/04* (2006.01)
*H03K 17/96* (2006.01)

(52) U.S. Cl.
CPC ............ *H05K 9/0071* (2013.01); *H03K 2217/960755* (2013.01); *H03K 2217/960765* (2013.01)

(58) Field of Classification Search
USPC .............................................. 219/204, 209
See application file for complete search history.

(56) References Cited

U.S. PATENT DOCUMENTS

| | | | |
|---|---|---|---|
| 4,540,979 A | 9/1985 | Gerger | |
| 4,556,845 A | 12/1985 | Strope et al. | |
| 4,631,976 A * | 12/1986 | Noda | B62D 1/065 |
| | | | 219/204 |
| 4,801,771 A | 1/1989 | Mizuguchi et al. | |
| 4,929,934 A | 5/1990 | Ueda et al. | |
| 5,398,962 A | 3/1995 | Kropp | |
| 5,423,569 A | 6/1995 | Reighard et al. | |
| 5,453,941 A | 9/1995 | Yoshikawa | |
| 5,463,258 A | 10/1995 | Filion et al. | |
| 5,539,259 A | 7/1996 | Filion et al. | |
| 5,563,354 A | 10/1996 | Kropp | |
| 5,793,297 A | 8/1998 | Takeuchi et al. | |
| 5,871,063 A | 2/1999 | Young | |
| 5,914,658 A | 6/1999 | Arakawa | |
| 5,964,478 A | 10/1999 | Stanley et al. | |
| 5,965,952 A | 10/1999 | Podoloff et al. | |
| 6,016,103 A | 1/2000 | Leavitt | |
| 6,172,610 B1 | 1/2001 | Prus | |
| 6,239,409 B1 * | 5/2001 | Bonn | B60R 16/037 |
| | | | 219/202 |
| 6,239,593 B1 | 5/2001 | Burkhardt | |
| 6,333,736 B1 | 12/2001 | Sandbach | |
| 6,365,875 B1 * | 4/2002 | Kreuzer | B62D 1/06 |
| | | | 219/204 |
| 6,378,384 B1 | 4/2002 | Atkinson et al. | |
| 6,392,542 B1 | 5/2002 | Stanley et al. | |
| 6,495,799 B1 * | 12/2002 | Pillsbury, IV | B60R 21/21656 |
| | | | 219/204 |
| 6,501,463 B1 | 12/2002 | Dahley et al. | |
| 6,590,499 B1 | 7/2003 | D'Agosto | |
| 6,661,345 B1 | 12/2003 | Bevan | |
| 6,703,845 B2 | 3/2004 | Stanley et al. | |
| 6,906,700 B1 | 6/2005 | Armstrong | |
| 6,918,610 B2 | 7/2005 | Song et al. | |
| 7,126,583 B1 | 10/2006 | Breed | |
| 7,321,311 B2 * | 1/2008 | Rieth | B62D 1/046 |
| | | | 180/271 |
| 7,649,278 B2 | 1/2010 | Yoshida et al. | |
| 7,687,747 B2 * | 3/2010 | Lee | H05B 3/342 |
| | | | 219/539 |
| 7,688,213 B2 | 3/2010 | Power | |
| 7,763,187 B1 | 7/2010 | Veedu | |
| 7,830,265 B2 | 11/2010 | Power | |
| 7,908,941 B2 * | 3/2011 | Menaldo | B62D 1/065 |
| | | | 219/204 |
| 7,928,341 B2 | 4/2011 | Ito et al. | |
| 8,011,234 B2 * | 9/2011 | Kandler | B62D 1/046 |
| | | | 73/117.02 |
| 8,095,270 B2 | 1/2012 | Bossler et al. | |
| 8,203,454 B2 | 6/2012 | Knight et al. | |
| 8,214,105 B2 | 7/2012 | Daly et al. | |
| 8,269,731 B2 | 9/2012 | Molne | |
| 8,461,957 B2 | 6/2013 | Haag | |
| 8,564,424 B2 * | 10/2013 | Evarts | B60Q 9/00 |
| | | | 340/426.24 |
| 8,698,764 B1 | 4/2014 | Karakotsios et al. | |
| 8,841,929 B2 * | 9/2014 | Bennett | B62D 1/06 |
| | | | 324/600 |
| 8,952,907 B2 | 2/2015 | Brown et al. | |
| 8,970,231 B2 | 3/2015 | Kandler | |
| 8,970,232 B2 * | 3/2015 | Kandler | B60N 2/002 |
| | | | 324/660 |
| 8,983,732 B2 | 3/2015 | Bosch et al. | |
| 9,007,190 B2 | 4/2015 | Bosch et al. | |
| 9,266,454 B2 * | 2/2016 | Barfuss | B60N 2/002 |
| 9,346,480 B2 * | 5/2016 | Maguire | B62D 1/046 |
| 2001/0030182 A1 * | 10/2001 | Haag | B62D 1/065 |
| | | | 219/204 |
| 2002/0036119 A1 | 3/2002 | Bonn et al. | |
| 2002/0054060 A1 | 5/2002 | Schena | |
| 2002/0080014 A1 * | 6/2002 | McCarthy | B60N 2/002 |
| | | | 340/426.1 |
| 2003/0043014 A1 | 3/2003 | Nakazawa et al. | |
| 2003/0074092 A1 | 4/2003 | Carrabis | |
| 2003/0076968 A1 | 4/2003 | Rast | |
| 2003/0083131 A1 | 5/2003 | Armstrong | |
| 2003/0111453 A1 * | 6/2003 | Haag | B62D 1/065 |
| | | | 219/204 |
| 2004/0144197 A1 | 7/2004 | O'Grady | |
| 2004/0155020 A1 * | 8/2004 | Worrell | H05B 3/48 |
| | | | 219/204 |
| 2004/0212189 A1 | 10/2004 | Kachu | |
| 2004/0267422 A1 | 12/2004 | Bossler et al. | |
| 2005/0052426 A1 * | 3/2005 | Hagermoser | B60K 35/00 |
| | | | 345/173 |
| 2005/0067889 A1 | 3/2005 | Chernoff et al. | |
| 2005/0260492 A1 | 11/2005 | Tucholski et al. | |
| 2005/0273218 A1 | 12/2005 | Breed et al. | |
| 2006/0025897 A1 | 2/2006 | Shostak et al. | |
| 2006/0054479 A1 | 3/2006 | Iisaka et al. | |
| 2006/0066085 A1 | 3/2006 | Durocher | |
| 2006/0109256 A1 | 5/2006 | Grant et al. | |
| 2006/0113880 A1 | 6/2006 | Pei et al. | |
| 2006/0177212 A1 | 8/2006 | Lamborghini et al. | |
| 2006/0231320 A1 | 10/2006 | Kamizono et al. | |
| 2006/0248478 A1 | 11/2006 | Liau | |
| 2006/0262103 A1 | 11/2006 | Hu et al. | |
| 2006/0284839 A1 | 12/2006 | Breed et al. | |
| 2007/0029768 A1 * | 2/2007 | Clos | B60R 21/01532 |
| | | | 280/735 |
| 2007/0062753 A1 * | 3/2007 | Yoshida | B60K 37/06 |
| | | | 180/333 |
| 2007/0100523 A1 | 5/2007 | Trachte | |
| 2007/0187134 A1 * | 8/2007 | Detian | C22F 1/08 |
| | | | 174/126.1 |
| 2007/0210050 A1 * | 9/2007 | Choi | B62D 1/065 |
| | | | 219/204 |
| 2007/0278214 A1 | 12/2007 | Weiss | |
| 2008/0042856 A1 | 2/2008 | Power | |
| 2008/0061954 A1 | 3/2008 | Kulas | |
| 2008/0079604 A1 | 4/2008 | Madonna et al. | |
| 2008/0085021 A1 * | 4/2008 | Shim | A61N 1/16 |
| | | | 381/189 |
| 2008/0202912 A1 | 8/2008 | Boddie et al. | |
| 2008/0210048 A1 | 9/2008 | Yoneyama et al. | |
| 2009/0001855 A1 | 1/2009 | Lipton et al. | |
| 2009/0009480 A1 | 1/2009 | Heringslack | |
| 2009/0032524 A1 * | 2/2009 | Li | H05B 3/345 |
| | | | 219/529 |
| 2009/0140994 A1 | 6/2009 | Tanaka et al. | |
| 2009/0151447 A1 | 6/2009 | Jin et al. | |
| 2009/0160529 A1 | 6/2009 | Lamborghini et al. | |
| 2009/0199676 A1 * | 8/2009 | Kandler | B62D 1/046 |
| | | | 74/552 |
| 2009/0241378 A1 | 10/2009 | Ellis | |
| 2010/0045454 A1 | 2/2010 | Knight et al. | |
| 2010/0045612 A1 | 2/2010 | Moline | |
| 2010/0053087 A1 | 3/2010 | Dai et al. | |
| 2010/0071502 A1 * | 3/2010 | Yasuda | B62D 1/065 |
| | | | 74/552 |
| 2010/0096159 A1 * | 4/2010 | Abe | H01B 13/16 |
| | | | 174/110 F |
| 2010/0102972 A1 | 4/2010 | Middlekauff et al. | |
| 2010/0130808 A1 | 5/2010 | Hattori | |
| 2010/0168998 A1 | 7/2010 | Matsunaga | |
| 2010/0200268 A1 * | 8/2010 | Suzuki | C08J 9/0061 |
| | | | 174/110 SR |
| 2010/0231239 A1 | 9/2010 | Tateishi et al. | |

(56) References Cited

U.S. PATENT DOCUMENTS

| | | |
|---|---|---|
| 2010/0250071 A1 | 9/2010 | Pala et al. |
| 2010/0268426 A1 | 10/2010 | Pathak et al. |
| 2010/0277186 A1 | 11/2010 | Bieck et al. |
| 2010/0315267 A1 | 12/2010 | Chung et al. |
| 2011/0037721 A1 | 2/2011 | Cranfill |
| 2011/0046788 A1* | 2/2011 | Daly ................. H04B 1/082 700/275 |
| 2011/0054359 A1 | 3/2011 | Sazonov et al. |
| 2011/0073384 A1* | 3/2011 | Osoinach ........... G06F 3/0416 178/18.06 |
| 2011/0115617 A1 | 5/2011 | Bennett |
| 2011/0133919 A1 | 6/2011 | Evarts et al. |
| 2011/0175844 A1 | 7/2011 | Berggren |
| 2011/0189890 A1 | 8/2011 | Lee et al. |
| 2011/0210926 A1* | 9/2011 | Pasquero ............ G06F 3/016 345/173 |
| 2011/0216015 A1 | 9/2011 | Edwards |
| 2011/0241850 A1 | 10/2011 | Bosch et al. |
| 2011/0245992 A1 | 10/2011 | Stahlin et al. |
| 2011/0246028 A1* | 10/2011 | Lisseman ........... B60K 28/066 701/45 |
| 2011/0257846 A1 | 10/2011 | Bennett |
| 2011/0290038 A1 | 12/2011 | Hoshino et al. |
| 2012/0038468 A1 | 2/2012 | Provancher |
| 2012/0126965 A1 | 5/2012 | Sanma et al. |
| 2012/0179328 A1 | 7/2012 | Goldman-Shenhar |
| 2012/0232751 A1 | 9/2012 | Guspan |
| 2012/0296528 A1 | 11/2012 | Wellhoefer et al. |
| 2012/0306512 A1* | 12/2012 | Kandler ............. B60N 2/002 324/686 |
| 2012/0326735 A1* | 12/2012 | Bennett ............. B62D 1/046 324/705 |
| 2013/0003451 A1* | 1/2013 | Bedeschi ........... G11C 16/3418 365/163 |
| 2013/0009654 A1* | 1/2013 | Kandler ............. B60N 2/002 324/686 |
| 2013/0027065 A1 | 1/2013 | Stanley et al. |
| 2013/0098890 A1* | 4/2013 | Virnich ............. B60N 2/5685 219/204 |
| 2013/0120052 A1* | 5/2013 | Siska ................ H03K 17/962 327/517 |
| 2013/0277351 A1 | 10/2013 | Lamesch |
| 2014/0054880 A1 | 2/2014 | Feinstein |
| 2014/0076063 A1 | 3/2014 | Lisseman et al. |
| 2014/0092025 A1 | 4/2014 | Pala et al. |
| 2014/0110388 A1* | 4/2014 | Fassbender ......... H05B 3/0014 219/204 |
| 2014/0151356 A1 | 6/2014 | Maguire et al. |
| 2014/0175078 A1* | 6/2014 | Davignon ........... B32B 3/06 219/204 |
| 2014/0224040 A1 | 8/2014 | Van'tZelfde et al. |
| 2014/0246415 A1* | 9/2014 | Wittkowski ........ B60N 2/5685 219/201 |
| 2014/0253151 A1* | 9/2014 | Kandler ............. B62D 1/046 324/686 |
| 2014/0326708 A1* | 11/2014 | Barfuss ............. H05B 3/04 219/204 |
| 2014/0331815 A1 | 11/2014 | Rispoli et al. |
| 2015/0028015 A1* | 1/2015 | Park ................. B62D 1/065 219/204 |
| 2015/0048845 A1* | 2/2015 | Petereit ............. H03K 17/955 324/663 |
| 2015/0054317 A1 | 2/2015 | Fortune et al. |
| 2015/0177204 A1* | 6/2015 | Bessen .............. G01N 15/0656 73/1.06 |
| 2015/0205421 A1 | 7/2015 | Lin et al. |
| 2015/0345998 A1* | 12/2015 | Lamesch ............ B60N 2/5685 324/686 |
| 2015/0369633 A1* | 12/2015 | Karasawa ........... B62D 1/046 324/686 |
| 2016/0038009 A1* | 2/2016 | Khait ............... A61B 5/062 600/302 |
| 2016/0375910 A1* | 12/2016 | McMillen .......... B60W 50/0098 701/36 |

FOREIGN PATENT DOCUMENTS

| | | |
|---|---|---|
| CN | 102745231 | 10/2012 |
| DE | 202004020425 | 8/2005 |
| DE | 102009058138 | 6/2006 |
| DE | 102005024432 | 10/2006 |
| DE | 102007024141 | 11/2008 |
| DE | 102011006448 | 10/2011 |
| DE | 102012000572 | 7/2013 |
| JP | 61-146671 | 7/1986 |
| JP | 61-146670 | 9/1986 |
| JP | 09226597 | 9/1997 |
| JP | 2000228126 | 8/2000 |
| JP | 2002538044 A | 11/2002 |
| JP | 2007114122 | 5/2007 |
| JP | 2008-059459 | 3/2008 |
| JP | 2010-026610 | 2/2010 |
| JP | 2011-063103 | 3/2011 |
| JP | 2011219085 | 11/2011 |
| JP | 2013505865 | 2/2013 |
| WO | 9638325 A1 | 12/1996 |
| WO | 2011016868 | 10/2011 |
| WO | 2014130188 A1 | 8/2014 |

OTHER PUBLICATIONS

Non-Final Office Action issued in U.S. Appl. No. 14/353,109, dated Feb. 23, 2017.
Non-final Office Action issued in U.S. Appl. No. 14/728,366 dated Nov. 21, 2016.
International Search Report and Written Opinion issued in PCT/US15/33708, dated Sep. 2, 2015.
International Preliminary Report on Patentability issued in PCT/US15/33708, dated Dec. 15, 2016.
International Search Report, dated Sep. 2, 2015, received in connection with International Application No. PCT/US2015/033708.
Written Opinion, dated Sep. 2, 2015, received in connection with International Application No. PCT/US2015/033708.
International Search Report, dated Aug. 28, 2015, received in connection with International Application No. PCT/US2015/032116.
Written Opinion, dated Aug. 28, 2015, received in connection with International Application No. PCT/US2015/032116.
International Preliminary Report on Patentability and Written Opinion, dated Aug. 18, 2015, received in connection with PCT/US2014/016023.
International Search Report and Written Opinion, dated May 23, 2014, received in connection with International Application No. PCT/US2014/016023.
Office Action, dated Jun. 30, 2015, received in connection with JP Application No. 2011-082736. (English Translation).
Office Action, dated Nov. 4, 2014, received in connection with JP Application No. 2011-082736. (English Translation).
U.S. Appl. No. 14/178,578, filed Feb. 12, 2014.
Notice of Allowance, dated Sep. 25, 2015, received in connection with U.S. Appl. No. 14/178,578, filed Feb. 12, 2014.
Non Final Office Action in U.S. Appl. No. 14/178,578 dated May 11, 2015.
U.S. Appl. No. 13/078,793, filed Apr. 1, 2011 (now U.S. Pat. No. 8,983,732, issued Mar. 17, 2015).
Notice of Allowance, dated Nov. 3, 2014, received in connection with U.S. Appl. No. 13/078,793, filed Apr. 1, 2011 (now U.S. Pat. No. 8,983,732, dated Mar. 17, 2015).
Final Office Action in U.S. Appl. No. 13/078,793 dated May 6, 2014.
Non Final Office Action in U.S. Appl. No. 13/078,793 dated Dec. 16, 2013.

(56) References Cited

OTHER PUBLICATIONS

Non Final Office Action in U.S. Appl. No. 13/078,793 dated Dec. 6, 2012.
Final Office Action in U.S. Appl. No. 13/078,793 dated Jun. 3, 2013.
Final Office Action in U.S. Appl. No. 13/078,793 dated Mar. 15, 2013.
U.S. Appl. No. 13/076,226, filed Mar. 30, 2011 (now U.S. Pat. No. 9,007,190, issued Apr. 14, 2015).
Supplemental Notice of Allowance, dated Feb. 20, 2015, received in connection with U.S. Appl. No. 13/076,226.
Notice of Allowance, dated Dec. 23, 2014, received in connection with U.S. Appl. No. 13/076,226.
Non Final Office Action in U.S. Appl. No. 13/076,226 dated Sep. 11, 2014.
Final Office Action in U.S. Appl. No. 13/076,226 dated Feb. 13, 2014.
Non Final Office Action in U.S. Appl. No. 13/076,226 dated Mar. 11, 2013.
U.S. Appl. No. 14/728,366, filed Jun. 2, 2015.
International Preliminary Report on Patentability and Written Opinion, dated Apr. 22, 2014, in connection with corresponding International Application No. PCT/EP2012/070777.
"Modellierung und Realisierung eines digitalen Trägerfrequenzmesssystems zur Messung von kapazitiven Sensoren im Umfeld einer Ultrapräzisionsdrehmaschine" Dipl.- Ing. Jonas Bluth aus Rutesheim "Modeling and realization of a digital Carrier frequency measuring system for the measurement of capacitive sensors in the Environment of an ultra-precision turning machine"—Dissertation by Jonas Bluth—English abstract included.
Office Action issued in co-pending U.S. Appl. No. 14/353,109, dated Apr. 21, 2016.
Office Action issued in co-pending U.S. Appl. No. 14/353,109, dated Sep. 15, 2016.
Office Action issued in co-pending U.S. Appl. No. 14/353,109, dated Feb. 23, 2017.
Office Action issued in Chinese Application No. 201480008587.9, dated Oct. 9, 2016, English translation included.
International Preliminary Report on Patentability issued for International Application No. PCT/US15/32116, dated Dec. 1, 2016.
Comeford, "Proximity Sensing Solutions, Part 1: Capacitive Sensors", DigiKey Electronics, Sep. 19, 2013, 3 pages.
Office Action issued for Chinese Application No. 201580027253, dated Jun. 27, 2018.
Office Action issued for Chinese Application No. 201580029042, dated May 28, 2018.

* cited by examiner

SYSTEMS AND METHODS FOR SHIELDING A HAND SENSOR SYSTEM IN A STEERING WHEEL

CROSS REFERENCE TO RELATED APPLICATIONS

This application claims priority to U.S. Provisional Patent Application No. 62/001,968 entitled "Systems and Methods for Shielding a Hand Sensor System in a Steering Wheel", filed May 22, 2014, the content of which is herein incorporated by reference in its entirety.

BACKGROUND

Current steering wheel designs may include a sensor mat disposed around a rim of a steering wheel that detects presence of one or more hands on the steering wheel rim. The sensor mat is disposed between an outer skin of the steering wheel and a rim of a steering wheel frame. The steering wheel frame is typically made of metal, such as a magnesium alloy or steel, and can be a source of interference for the electrical signal(s) in the sensor mat.

Accordingly, there is a need in the art for improved systems and methods for shielding a sensor system in a steering wheel.

BRIEF SUMMARY

Systems and methods of shielding a hand sensor system in a steering wheel are disclosed herein. According to various implementations, the hand sensor system includes a sensor mat and a shield mat that is disposed between the sensor mat and the frame of the steering wheel. A power source is configured for providing a current to the shield mat, which prevents interference between the steering wheel frame and the sensor mat. A heater mat disposed around the steering wheel frame may be used as the shield mat by selectively generating a heating current for the heater function or a voltage signal for the shield function of the mat, or a separate heater mat and shield mat may be provided. Heating current levels may be between about 4 and about 8 amperes, are generated. Shielding current levels may be less than about 200 microamperes. In certain implementations, separate power sources may be provided to generate the heating current for heating and the voltage signal for shielding, or one power source may selectively provide the heating current for heating and the voltage signal for shielding.

In addition, in implementations in which the sensor mat provides more than one sensing zone, a sensor return wire from one sensing zone may interfere with a signal(s) carried by a sensor return wire from an adjacent sensing zone if the sensor return wires are too close. To isolate the signals carried by individual sensor return wires, a metallic or insulating covering or dielectric or insulating conduit may be provided around the wires or a portion thereof. By shielding the sensor mat properly, noisy or "shorted" measurements are prevented.

According to various implementations, a system for shielding a hand sensor system in a steering wheel includes a sensor mat, a shield mat, and an electronic control unit. The sensor mat includes one or more sensing loops, and each of the sensing loops defines a sensing zone. The shield mat is disposed between a steering wheel frame, and the shield mat and includes one or more conductive loops. Each of the conductive loops defines a conductive zone. The electronic control unit (ECU) is in communication with the shield mat and includes a power source configured for generating a voltage signal configured for shielding one or more sensing zones of the sensor mat from interference from the steering wheel frame.

The system may also include a heater mat disposed between the shield mat and the steering wheel frame. In one implementation, the heater mat is in communication with the ECU, and the power source is configured for selectively generating a heating current for the heater mat for heating the steering wheel and the voltage signal for the shield mat for shielding one or more sensing zones. In other implementations, separate first and second power sources may be provided, wherein the first power source is configured for generating the heating current for the heater mat and the second power source is configured for generating the voltage signal for the shielding mat. The first and second power sources may be provided in one ECU or in separate ECUs.

According to various other implementations, a system for shielding a hand sensor system in a steering wheel includes a sensor mat, a heater mat, and an electronic control unit. The sensor mat includes one or more sensing loops, and each of the sensing loops defines a sensing zone. The heater mat is disposed between a steering wheel frame and the sensor mat and includes one or more conductive loops. Each of the conductive loops defines a conductive zone. The electronic control unit is in communication with the heater mat and includes a power source configured for selectively generating a heating current configured for heating at least a portion of the steering wheel and a voltage signal configured for shielding the sensor mat from interference from the steering wheel frame. The heating current is greater than a shielding current.

In certain implementations, the one or more sensing loops may include a first sensing loop and a second sensing loop. The first sensing loop is spaced apart from the second sensing loop. The one or more conductive loops of the shield mat or combination shield/heater mat may include a first conductive loop adjacent the first sensing loop and a second conductive loop adjacent the second sensing loop for selectively shielding or heating one or more areas at a time.

According to certain implementations, the power source is configured for generating the heating current for the first conductive loop of the heater mat in response to receiving a first presence signal from the first sensing loop indicating presence of a hand or other body part adjacent the first sensing loop or for the second conductive loop of the heater mat in response to receiving a second presence signal from the second sensing loop indicating presence of a hand or other body part adjacent the second sensing loop. Alternatively, the power source may be configured for generating the heating current for at least one or more of the conductive loops of the heater mat in response to receiving an on signal for the heater mat.

In addition, the power source is further configured for generating the shielding voltage signal for the first or second conductive zone in response to receiving a signal (e.g., an override signal) indicating that sensing in the first or second sensing zone, respectively, takes priority over heating. The electronic control unit is also configured for ceasing to generate the heating current for the one or more conductive loops of the heater mat in response to a temperature of a respective sensing zone reaching a set temperature. In addition, the electronic control unit may be configured for alternately generating the heating current and the shielding voltage signal periodically, such as every about 10 to about 50 milliseconds. The above described implementations may also include a metallic shield disposed around at least a portion of one or more wires connected to the sensor mat. The metallic shield is configured for substantially isolating an electrical signal carried by the shielded wire from another wire adjacent the shielded wire. The metallic shield may extend around substantially all of the wire that extends from each sensing loop. Alternatively, the metallic shield may extend around the portion of the wire extending from one sensing loop that crosses another sensing loop.

In addition, the system may also include a conduit comprising a dielectric material. At least a portion of the wires extending from the sensor mat are disposed within the conduit. For example, the conduit may include a first conduit for at least a portion of the first wire and a second conduit for at least a portion of the second wire.

Other various implementations may include methods of shielding a hand sensor system in a steering wheel. According to certain implementations, the hand sensor system includes a shield mat disposed between a steering wheel frame and a sensor mat. The sensor mat includes one or more sensing loops, and each sensing loop defines a sensing zone and is configured for detecting input from a driver's hand adjacent thereto. The shield mat includes one or more conductive loops, and each of the conductive loops defines a conductive zone. The method includes providing a voltage signal to at least one of the one or more conductive loops of the shield mat to shield a portion of the sensor mat adjacent the conductive zone from the steering wheel frame. A shielding current may be less than about 200 microamperes. In certain implementations, the hand sensor system further includes a heater mat, and the heater mat is disposed between the frame and the shield mat. The method further includes providing a heating current to the heater mat, such as between about 4 and about 8 amperes.

According to other implementations, the hand sensor system includes a heater mat between a steering wheel frame and a sensor mat. The sensor mat includes one or more sensing loops, and each sensing loop defines a sensing zone and is configured for detecting input from a driver's hand adjacent thereto. The heater mat includes one or more conductive loops, and each of the conductive loops defines a conductive zone. The method includes: (1) selectively providing a heating current to at least one of the one or more conductive loops of the heater mat to heat at least one of the one or more conductive zones of the steering wheel; and (2) selectively providing a voltage signal to at least one of the one or more conductive loops of the heater mat to shield a portion of the sensor mat adjacent the conductive zone from the steering wheel frame. The heating current is greater than a shielding current.

BRIEF DESCRIPTION OF THE DRAWINGS

The components in the drawings are not necessarily to scale relative to each other. Like reference numerals designate corresponding parts throughout the several views.

DETAILED DESCRIPTION

Systems and methods of shielding a hand sensor system in a steering wheel are disclosed herein. According to various implementations, the hand sensor system includes a sensor mat and a shield mat that is disposed between the sensor mat and a frame of the steering wheel. A power source provides a voltage signal to the shield mat to provide electrical shielding for the sensor mat. Interference with the electrical signal(s) carried by the sensor mat may occur due to the proximity of the sensor mat to the steering wheel frame, which is typically metal, and providing the shielding voltage signal to the shield mat prevents this interference. In addition, the system may also include a heater mat. The heater mat may be separate from the shield mat or it may be used as a combination heater and shielding mat. To use the heater mat as a shield mat, the power source generates a heating current for heating the steering wheel or the shielding voltage signal for using the heater mat as a shield mat. The heating current is greater than a shielding current.

Figure 1A:
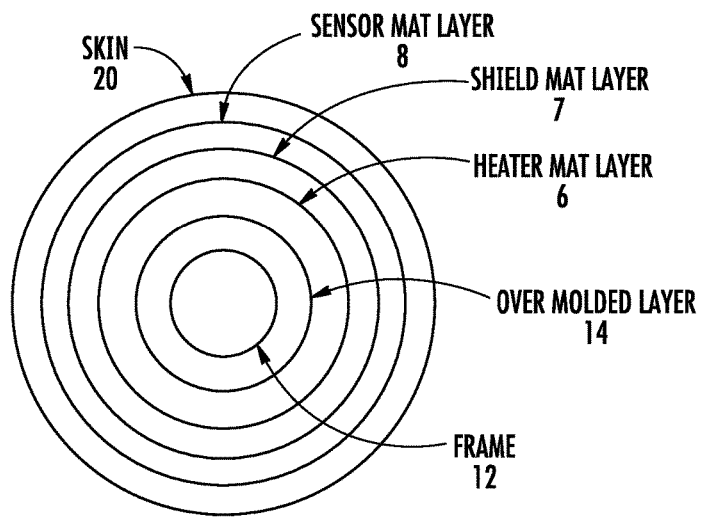
FIG. 1A illustrates a cross sectional view of layers in a steering wheel according to one implementation.

FIG. 1A illustrates a cross section of a steering wheel rim that includes a frame 12, an over molded layer 14 around the frame 12, a heater mat layer 6 around the over molded layer 14, a shield mat layer 7 around the heater mat layer 6, a sensor mat layer 8 around the shield mat layer 7, and a skin 20 around the sensor mat 8. The frame 12 is typically a magnesium alloy, aluminum alloy, steel, or a combination thereof, but it may be made of another suitable rigid material (s). The over molded layer 14 is formed from a polyurethane foam or thermoplastic elastomeric foam, for example. The outer skin 20 is typically made of leather or vinyl, but could also include wood, carbon fiber, plastic, polyurethane foam, fabrics, or any other suitable material. By keeping the shield mat layer 7 directly adjacent the sensor mat layer 8, the distance fluctuation between the two layers due to thermal expansion and contraction is minimized. In addition, the distance between these layers is further minimized by the tension of the outer skin 20 squeezing the layers together.

Figure 1B:
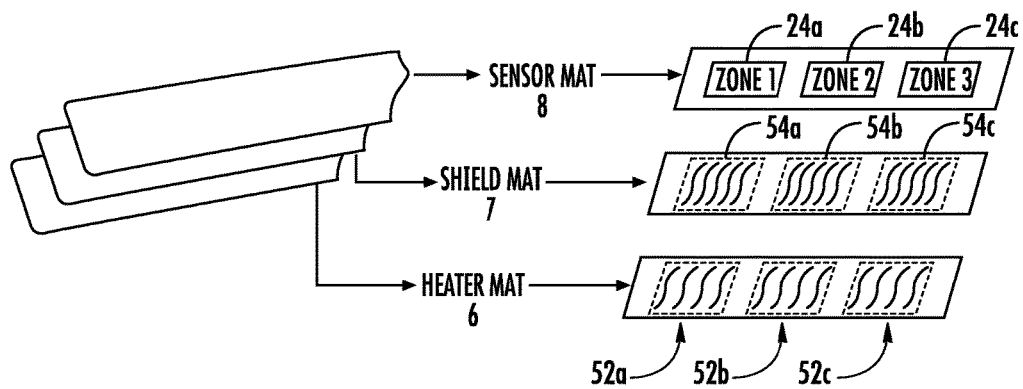
FIG. 1B illustrates a perspective view of a sensor mat layer, a shield mat layer, and heater mat layer according to the implementation in FIG. 1A.

FIG. 1B illustrates a perspective view of the sensor mat 8, shield mat 7, and heater mat 6 shown in FIG. 1A. The sensor mat 8 may include one or more sensing zones, such as sensing zones 24a, 24b, 24c, which are designated as zones 1-3 for example, that are distinct and spaced apart from each other, such as the sensor mats described in U.S. patent application Ser. No. 14/178,578, entitled Steering Wheel Hand Detection Systems and filed Feb. 12, 2014, which is herein incorporated by reference in its entirety. In addition, the shield mat 7 and the heater mat 6 may include one or more conductive zones, such as conductive zones 54a, 54b, 54c and 52a, 52b, 52c, respectively, which correspond to the sensing zones on the sensor mat and which allow for selective zone shielding and heating.

Figure 1C:
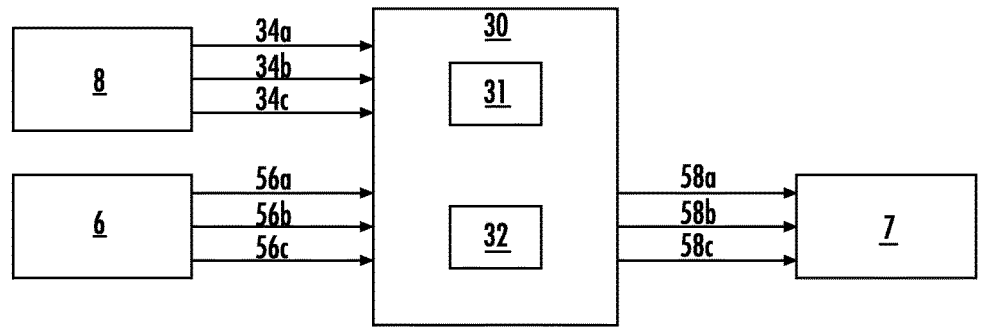
FIG. 1C illustrates a schematic diagram of the steering wheel system of FIGS. 1A and 1B.

An electronic control unit (ECU) 30, which is shown in FIG. 1C, is in electronic communication with the heater mat 6, the sensor mat 8, the shield mat 7, and one or more other vehicle systems (not shown). In particular, sensor return wires 34a-34c extend between the ECU 30 and each sensing loop 24a-24c, respectively, and conductive feed wires 56a-56c and 58a-58c extend between the ECU 30 and each conductive loop 52a-52c and 54a-54c for the heater mat 6 and the shield mat 7, respectively. The ECU 30 includes a processor 31 and a power source 32.

The processor 31 is configured for detecting input from a driver, such as presence of a hand, adjacent each sensing loop 24a-24c. In one implementation, an electrical signal from one or more sensing loops 24a-24c is communicated to the processor 31, and the processor 31 determines if the signal indicates input from the driver. For example, the signal may be generated through capacitance-type sensing, and the processor 31 may compare the generated signal with a range of signals that indicates presence of the driver's hand or other parts of the driver's body.

In addition to being configured to detect presence of a hand or other parts of the driver's body, the sensing loops 24a, 24b, 24c and the processor 31 may also be configured to detect various types of user input in each respective sensing zone, such as a grip, swipe motion, tap motion, etc., from signals received from the sensor mat. For example, by using a multi-zone sensor mat with the sensing loops disposed in specific areas, the sensor mat may be configured for detecting when no, one, or both hands are on the steering wheel and/or when a knee is touching the steering wheel.

The power source 32 is configured for selectively generating an electrical current through one or more conductive loops 52a-52c of the heater mat 6 for heating at least a portion of the outer skin 20 and a voltage signal through one or more conductive loops 54a-54c of the shield mat 7 for shielding at least a portion of the sensor mat 8 from interference from the steering wheel frame 12. The heating current is greater than a shielding current. For example, the heating current is around 4 to around 8 amperes, which is sufficient for producing heat for heating the skin 20 of the steering wheel, and the shielding current is less than about 200 microamperes, which is sufficient for shielding the sensor mat 8 from the steering wheel frame 12, according to some implementations. In certain implementations, for example, the shielding current may be between about 9 to about 11 microamperes. In one particular implementation, the heating current may be about 7 amperes and the shielding current may be around 10 microamperes. These electrical current values may be per zone or per channel and are input into the ECU 30, according to certain implementations.

In one implementation (not shown), the ECU 30 may include at least a first circuit and a second circuit between the power source 32 and the conductive loops 52a-52c and 54a-54c, respectively. The first circuit receives the heating current, which is a simple, resistive voltage current, to heat the area adjacent the conductive loops 52a-52c. The second circuit receives the shielding current, which may be a frequency-specific signal, for example, to shield the area adjacent the conductive loops 54a-54c. The frequency-specific signal of the second circuit is configured for matching, as close as possible, the capacitance voltage signal generated for the sensing mat.

The level of heating current or shielding voltage signal to be generated by the power source 32 and when the heating current or shielding voltage signal is generated is changed is controlled by the processor 31, according to one implementation. For example, in various implementations, the processor 31 may be configured to instruct the power source 32 to generate the heating current in one or more conductive loops 52a-52c in response to receiving input from a button, switch, or other suitable input mechanism disposed on the steering wheel or elsewhere in the vehicle. In another implementation, the processor 31 may be configured for generating the heating current in response to receiving input from one or more sensing loops 24a-24c. For example, in a particular implementation, the processor 31 may be further configured to instruct the power source 32 to generate the heating current for a particular conductive loop(s) 52a-52c that is adjacent the particular sensing loop(s) 24a-24c that senses the presence of the driver's hand(s). This configuration allows the system to save energy by only heating those portions of the steering wheel rim for which the presence of the driver's hand is sensed. For example, if the processor 31 senses the presence of the driver's hand adjacent sensing loop 24a, the processor 31 may generate the heating current through the conductive loop 52a that is adjacent sensing loop 24a to warm the portion of the steering wheel under the driver's hand.

In another implementation, or in addition to the implementation described above, the processor 31 may be configured for instructing the power source 32 to generate the heating current until the earlier of the steering wheel reaching a preset temperature or receiving an override signal from another vehicle system indicating that sensing in one or more zones takes priority over heating. In particular, the processor 31 may receive a temperature signal from one or more temperature sensors in the steering wheel and determine from the temperature signal whether the preset temperature has been reached. For example, a typical heater regulation range can be anywhere from about 30° C. to about 42° C. The temperature is typically detected using one or more thermistors, such as a negative temperature coefficient (NTC) type thermistor, according to certain implementations. The thermistor provides feedback to the processor 31, and the processor 31 uses the temperature feedback to regulate the target temperature on the steering wheel.

In addition, the override signal may indicate to the processor 31 that another system should receive electrical resources that would otherwise be allocated to the heater mat 6 for the heater function or that input from the sensor mat 8 takes priority over heating.

In another implementation, or in addition to the implementation described above, the processor 31 may be configured for instructing the power source 32 to alternate generation of the heating current and the shielding voltage signal periodically, such as alternating every about 10 to about 50 milliseconds. In other implementations, the period may be between about 10 to about 100 milliseconds. The period of alternation may be set based on the speed of the processor 31, the outside or inside temperature, or the preferences of the driver, for example. In addition, on board temperature monitoring may affect the timing, such as to prevent overheating of the controller itself. Or, if a specific fault condition is detected and the ECU 30 needs to prioritize managing that fault condition, the timing may be affected.

Figure 1D:
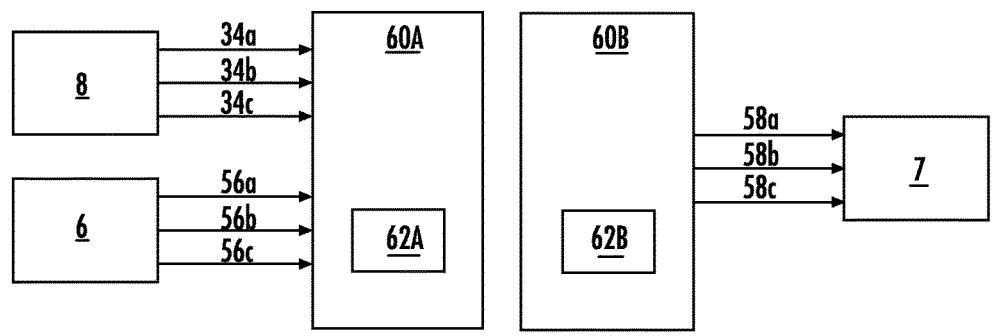
FIG. 1D illustrates a schematic diagram of the steering wheel system of FIGS. 1A and 1B according to an alternative implementation.
Figure 1E:
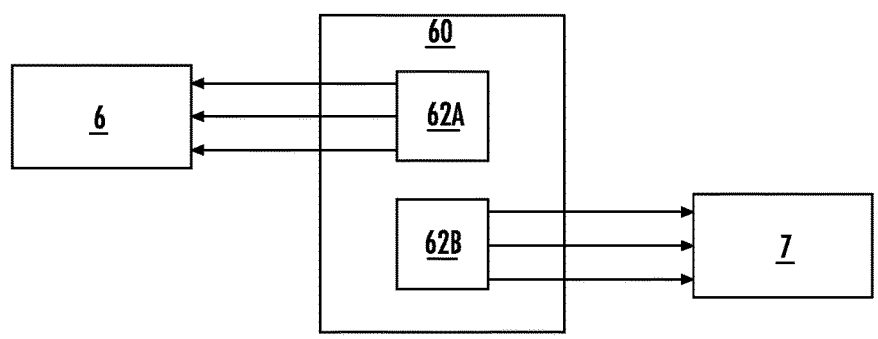
FIG. 1E illustrates a schematic diagram of the steering wheel system of FIGS. 1A and 1B according to another implementation.

In the alternative implementation shown in FIG. 1D, a first power source 62A is provided for generating a heating current for the heater mat 6 and a second power source 62B is provided for generating a shielding voltage signal for the shield mat 7. The first 62A and second power sources 62B are shown in FIG. 1D as being within two separate ECUs 60A, 60B, respectively, but, alternatively, these may be included in one ECU 60, as shown in FIG. 1E. These implementations allow the system to provide for continuous shielding and heating when desired, for example. In addition, ECU 60A or 60 may include a first circuit for receiving the heating current from power source 62A, which is a simple, resistive voltage current, to heat the area adjacent the conductive loops of heater mat 6. And, ECU 60B or 60 may include a second circuit for receiving the shielding voltage signal from power source 62B, which may be a frequency-specific signal, for example, to shield the area adjacent the conductive loops of shield mat 7.

Furthermore, in sensor mats having multiple zones, signals carried by sensor return wires associated with each sensing zone may generate noise in the sensing loops or sensor return wires associated with adjacent zones when the wires are too close to each other. This noise decreases the ability of the sensor mat to detect presence of a hand adjacent one or more sensing zones. In addition, cross talk from a sensor return wire from one zone that crosses over another zone may result in unintended detection from another zone. Accordingly, various implementations described herein, such as the implementations described related to FIGS. 5-10, provide for shielding around at least a portion of the sensor return wires that may be disposed adjacent another sensing zone or sensor return wire to isolate the signal(s) carried by the sensor return wire(s).

Figure 2:
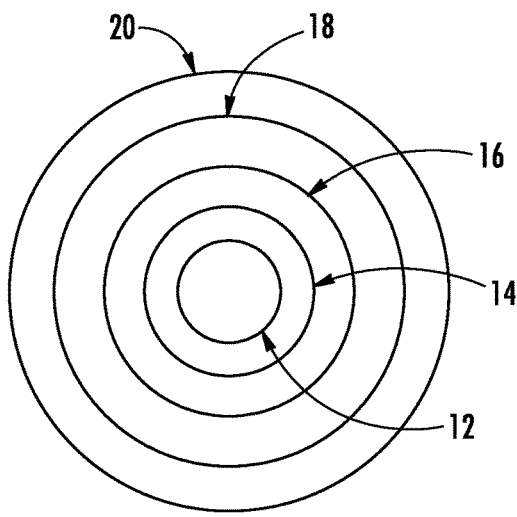
FIG. 2 illustrates a cross sectional view of layers in a steering wheel rim according to one implementation.

As mentioned above, the heater mat may be configured for serving as a heater mat and a shield mat, according to various implementations. FIG. 2 illustrates a cross sectional view of a steering wheel rim according to one such implementation. The steering wheel rim includes a steering wheel frame 12, an over molded layer 14 disposed around the steering wheel frame 12, a heater mat 16 disposed around the over molded layer 14, a sensor mat 18 disposed around the heater mat 16, and an outer skin 20 disposed over the sensor mat 18.

Figure 3A:
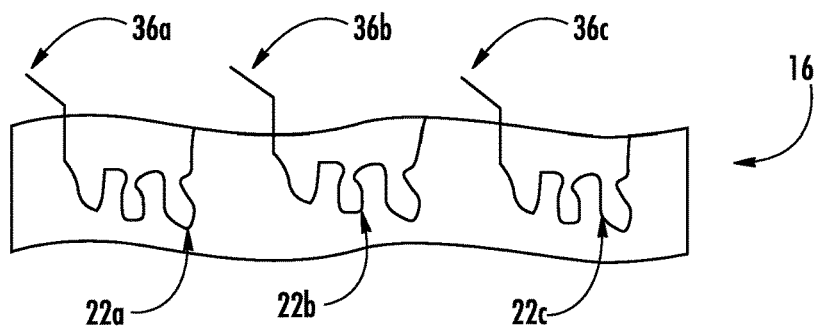
FIG. 3A illustrates a top view of the heater mat layer shown in FIG. 2.

FIG. 3A illustrates the heater mat 16 according to one implementation. The heater mat 16 includes one or more conductive loops, such as conductive loops 22a, 22b, 22c, and each loop 22a, 22b, 22c defines a conductive zone. The conductive loops 22a, 22b, 22c are spaced apart on the surface of the heater mat 16.

Figure 3B:
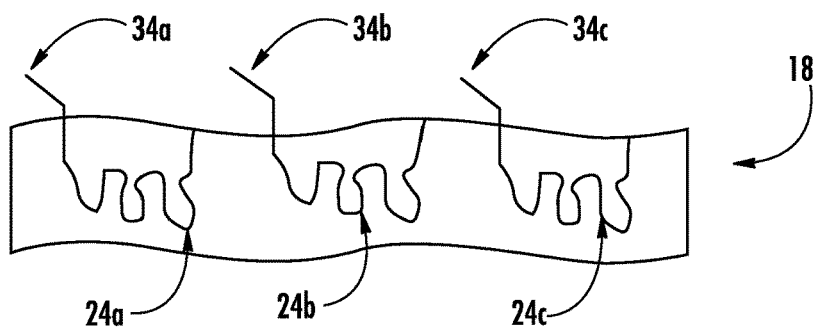
FIG. 3B illustrates a top view of the sensor mat layer shown in FIG. 2.

FIG. 3B illustrates the sensor mat 18 according to one implementation. The sensor mat 18 includes one or more sensing loops, such as sensing loops 24a, 24b, 24c, and each sensing loop 24a, 24b, 24c defines a sensing zone, such as zones 1, 2, and 3 shown in FIG. 1B and FIG. 5. The sensing loops 24a, 24b, 24c are spaced apart from each other on the surface of the sensor mat 18. As shown in FIG. 3B, the sensing loops 24a-24c may be capacitance type sensors. In addition, in other implementations, the sensor mat 18 may include one or more biometric sensors (e.g., sensing temperature, heart rate, etc.) or other suitable type of sensor.

Furthermore, biometric type sensors may be disposed in the vehicle to work in conjunction with hand sensing through the steering wheel using non-biometric type sensors. These biometric sensors may be disposed on the steering wheel or elsewhere in the vehicle. Examples of these biometric type sensors include retina detection, heart rate monitoring, arousal state monitoring, and driver detection (e.g., in a vehicle seat).

Figure 4:
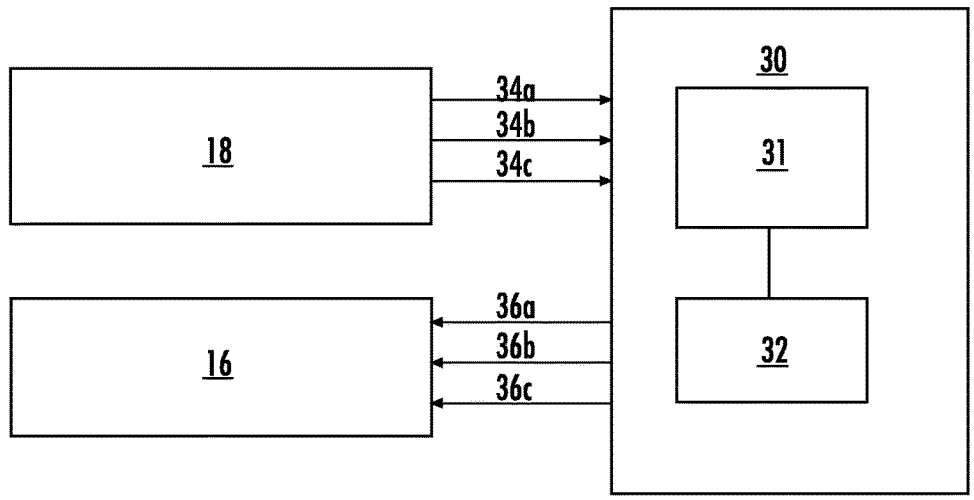
FIG. 4 illustrates a schematic diagram of the steering wheel system of FIG. 2.

As shown in FIG. 4, the ECU 30 is in electronic communication with the heater mat 16, the sensor mat 18, and one or more other vehicle systems (not shown). In particular, the sensor return wires 34a-34c extend between the ECU 30 and each sensing loop 24a-24c and conductive feed wires 36a-36c from the heater mat 16 extend between the ECU 30 and each conductive loop 22a-22c.

The power source 32 is configured for selectively generating a heating current through one or more conductive loops 22a-22c for heating at least a portion of the outer skin 20 and a shielding voltage signal through one or more conductive loops 22a-22c for shielding at least a portion of the sensor mat 18 from interference from the steering wheel frame 12. The heating current is greater than a shielding current. For example, the heating current is around 4 to around 8 amperes, which is sufficient for producing heat for heating the skin 20 of the steering wheel rim, and the shielding current is less than around 200 microamperes, which is sufficient for shielding the sensor mat 18 from the steering wheel frame 12. In a particular implementation, the heating current may be about 7 amperes and the shielding current may be between about 9 and about 11 microamperes. And, in a specific implementation, the shielding current may be around 10 microamperes. These electrical current values may be per zone or per channel and are input into the ECU 30, according to certain implementations. Various implementations of how the processor 31 determines which level of current to supply to the conductive loops 22a-22c are described above in relation to FIG. 1C. In addition, in an alternative implementation (not shown), the ECU 30 may include separate first and second power sources, wherein the first power source is configured for generating a shielding voltage signal and the second power source is configured for generating a heating current. Furthermore, ECU 30 may include a first circuit for receiving the heating current from power source 32, which is a simple, resistive voltage current, to heat the area adjacent the conductive loops 22a-22c. And, ECU 30 may include a second circuit for receiving the shielding voltage signal from power source 32, which may be a frequency-specific signal, for example, to shield the area adjacent the conductive loops 22a-22c.

Figure 5:
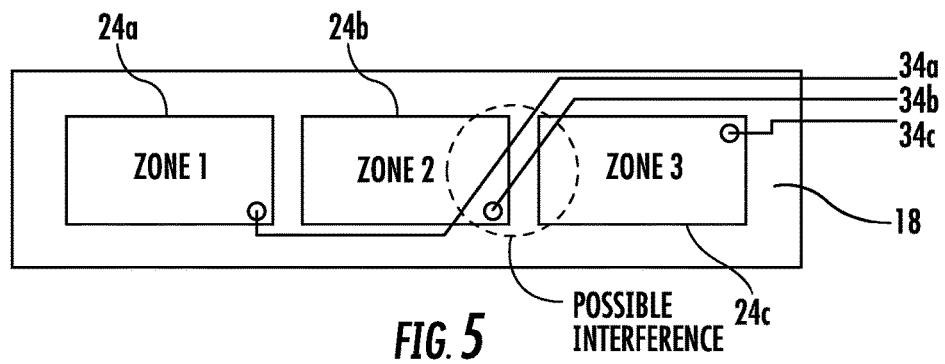
FIG. 5 illustrates a top view of the sensor mat of FIG. 3B showing a schematic area of each zone and the sensor return wires from each loop associated with each zone.

FIG. 5 illustrates a schematic top view of the sensor mat 18 showing the path of each of three sensor return wires 34a, 34b, 34c extending from their respective sensing loops 24a, 24b, 24c. As shown, the sensor return wire 34a extends over a portion of sensing loop 24b, which may be a source for interference for sensing loop 24b. To isolate the signal carried by the sensor return wires from each other while allowing for efficient routing of wires along the sensor mat 18, one or more of the sensor return wires 34a-34c extending between the ECU 30 and the sensing loops 24a-24c may include shielding around at least a portion of the sensor return wire 34a-34c. FIGS. 6A-10 illustrates various implementations of the wire shielding. Reference numeral 34 is used generally in these figures to refer to any sensor return wire that extends from the sensor mat 18.

Figure 6A:
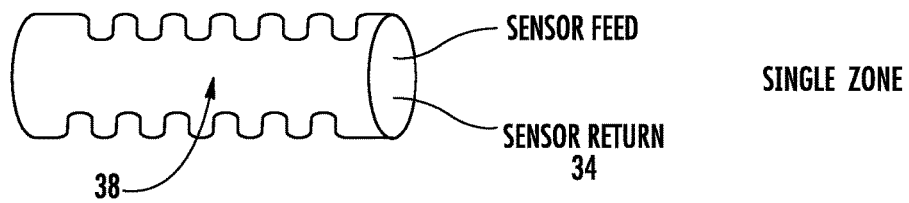
FIG. 6A illustrates a perspective view of a conduit shield around sensor feed and return wires for one sensor loop according to one implementation.
Figure 6B:
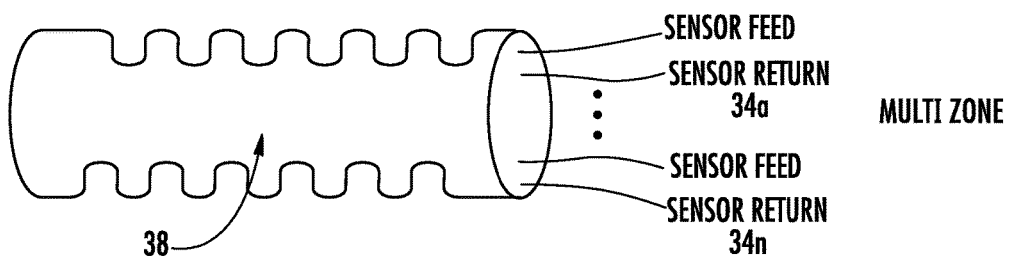
FIG. 6B illustrates a perspective view of a conduit shield around the sensor feed and the sensor return wires for sensor loops 1 through n according to one implementation.

In particular, FIGS. 6A and 6B illustrate a conduit 38 that includes a dielectric material. For example, the material may include nylon, PVC, polypropylene, or a metallic material. At least a portion of at least one sensor return wire 34 is disposed within the conduit 38. For example, the conduit 38 may be disposed between a particular sensor return wire 34 and a portion of an adjacent sensing loop for which the sensor return wire 34 may cause interference, such as in the area of possible interference shown in FIG. 5. Alternatively, the conduit 38 may be disposed around the portion of the sensor return wire 34 near the wire's connection to the sensor mat 18, around the portion of the sensor return wire 34 near the wire's connection to the ECU 30, or around all or most of the sensor return wire 34. One conduit may include a set of wires associated with each zone or sets of wires associated with multiple zones. FIG. 6A illustrates the conduit 38 having two wires associated with a single zone extending through it—a sensor return wire 34 that carries a signal from the single zone and a second, sensor feed wire that carries a signal to the zone. FIG. 6B illustrates the conduit 38 having more than one set of wires extending through it, wherein each set of two wires is associated with zones 1 through n and includes a sensor feed wire and sensor return wire.

Figure 7:
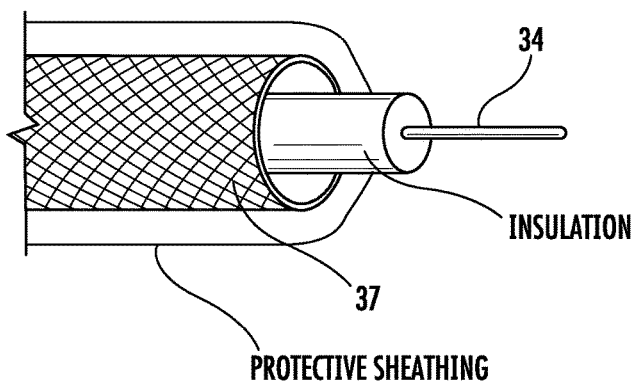
FIG. 7 illustrates a perspective view of a metallic shield around a sensor return wire according to one implementation.
Figure 8:
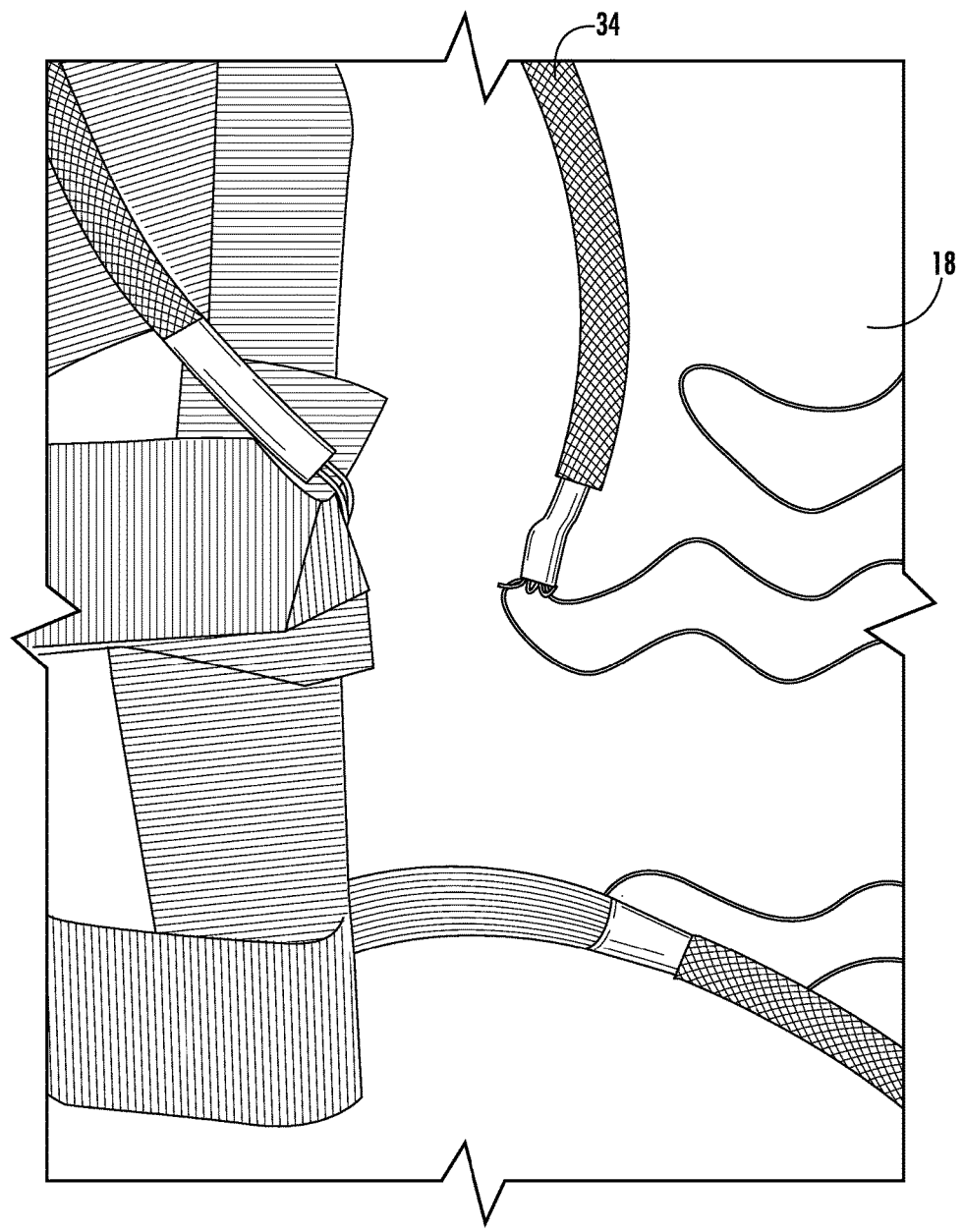
FIG. 8 illustrates the metallic shield shown in FIG. 7 attached to a sensor mat.

FIGS. 7 and 8 illustrate a metallic shield 37 around a portion of the sensor return wire 34. The metallic shield 37 is configured for substantially isolating an electrical signal carried by the shielded wire. For example, the metallic shield 37 may be a metallic braided conduit. For example, the material may include nylon, PVC, polypropylene, or a metallic material. As shown in FIG. 7, an insulating layer surrounds the sensor return wire 34, and the metallic shield 37 surrounds the insulating layer. A protective sheathing may be disposed around the metallic shield 37. The protective sheathing may include a thin layer of a dielectric material such as polyamide, silicon rubber, and polyester. In other implementations, another conductive layer may be used instead of the metallic braid shown in FIGS. 7 and 8. The protective sheathing may include a thin layer of a dielectric material such as polyamide, silicon rubber, and polyester.

Figure 9:
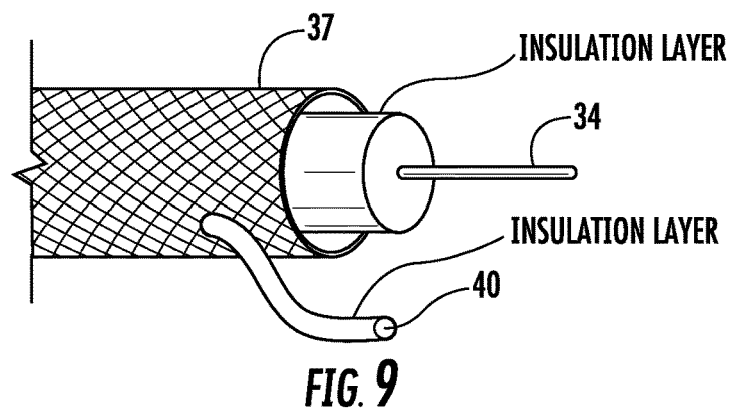
FIG. 9 illustrates a perspective view of a metallic shield around a sensor return wire with a shield return wire connected to the metallic shield according to one implementation.
Figure 10:
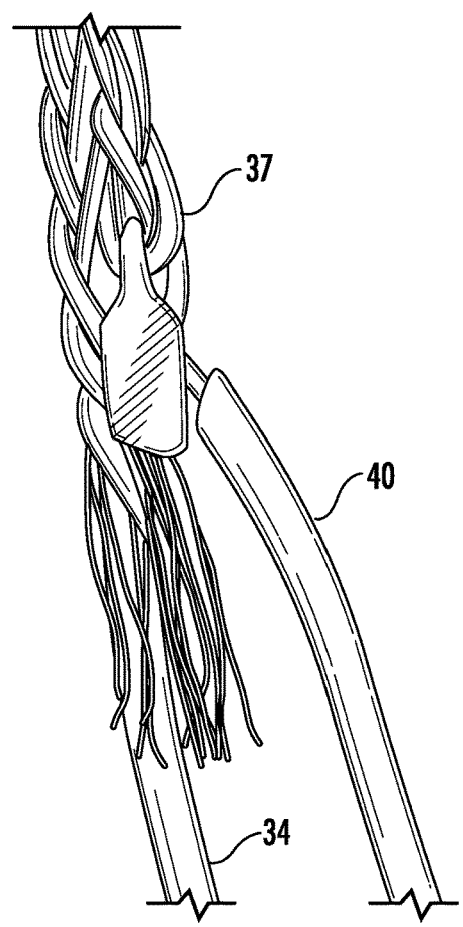
FIG. 10 illustrates the metallic shield shown in FIG. 9 wherein the shield return wire is soldered to the metallic shield.
Figure 11:
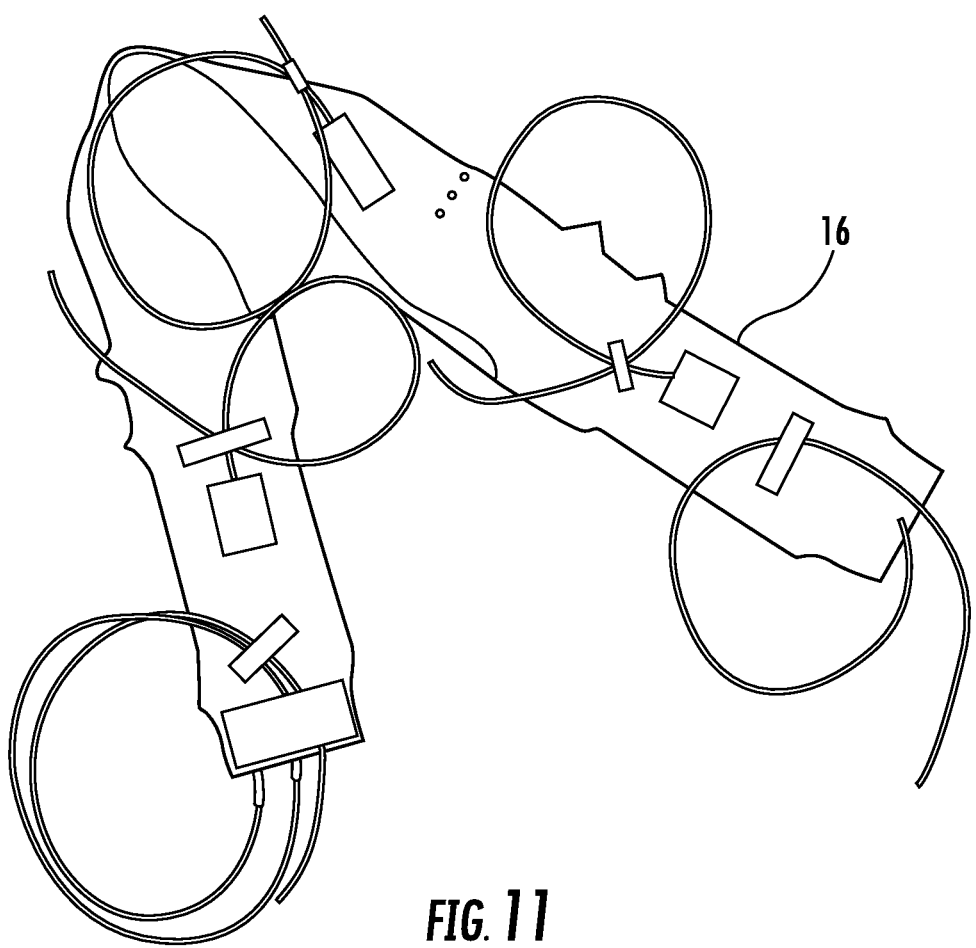
FIG. 11 illustrates a perspective view of the heater mat shown in FIG. 3A.

FIGS. 9 and 10 illustrate another implementation in which a shield return wire 40 is connected to the metallic shield 37 to further shield the sensor return wire 34 from interference. The shield return wire 40 shown in FIG. 10 is soldered to the metallic shield 37, but other suitable methods of attaching the shield return wire 40 to the metallic shield 37 may be used, such as, for example, crimping. The shield return wire 40 is connected to the ECU 30, and the power source 32 generates a current through the shield wire 40, which provides a desirable reference for preventing interference.

In addition, the metallic shield 37 shown in FIG. 7 or 9 and the conduit 38 shown in FIG. 6A or 6B may be used separately or in combination to provide sufficient shielding for the sensor return wires 34 extending between each sensing loop 24 and the ECU 30.

In the implementation shown in FIG. 5, the metallic shield 37 may be disposed around the portion of sensor return wire 34a extending from sensor loop 24a that extends over sensing loop 24b to isolate the two sensing zones from each other. However, in the implementation shown in FIG. 8, the metallic shield 37 is disposed around substantially all of the sensor return wire 34.

Figure 12:
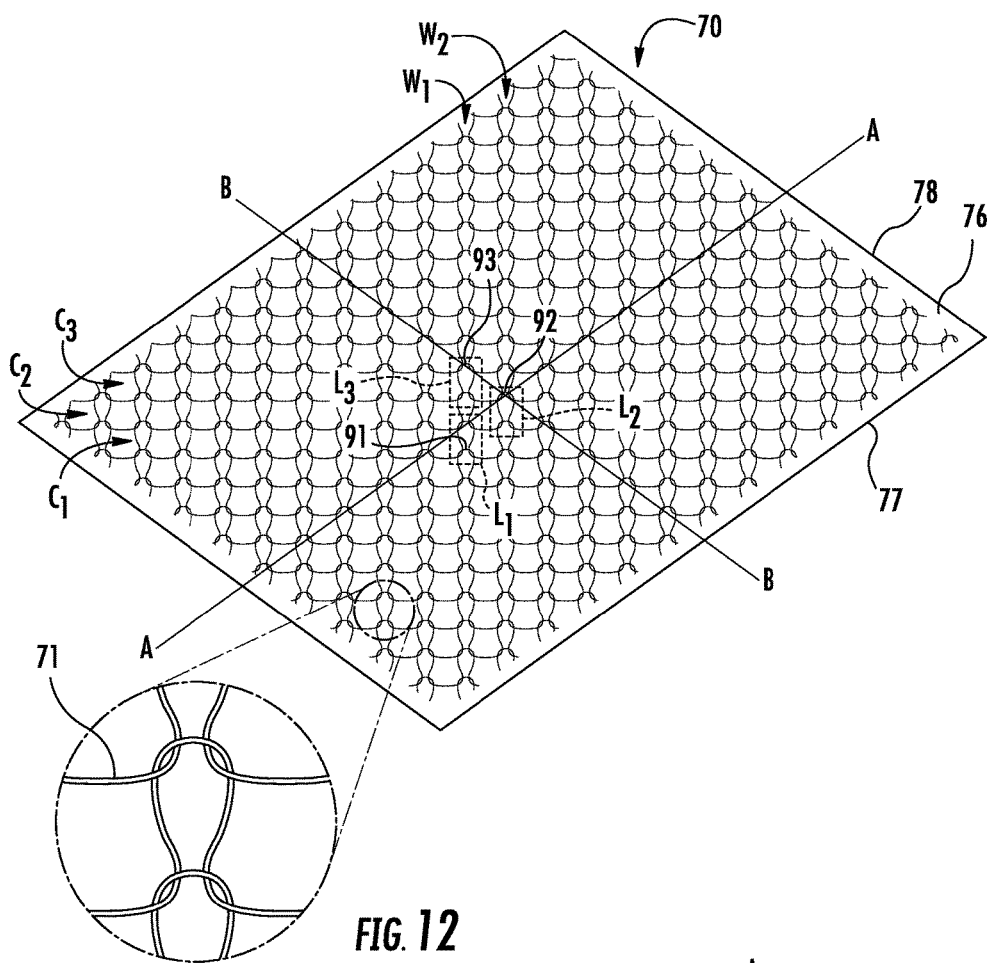
FIG. 12 illustrates a perspective view of a mesh shield mat layer according to one implementation.
Figure 13:
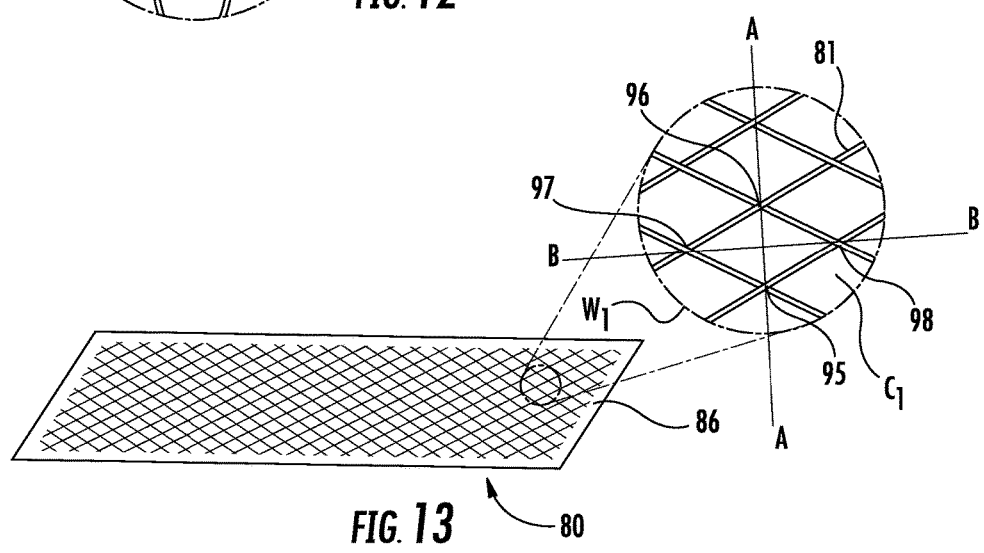
FIG. 13 illustrates a perspective view of a mesh shield mat layer according to another implementation.

The shield mat layer 7 described above in relation to FIGS. 1B and 3B may include one or more conductive wires stitched onto a backing layer. However, in alternative implementations, the conductive wire(s) on the shield mat layer may be arranged and/or secured to the backing layer differently. For example, alternative implementations of a shield mat layer may include a knitted metallic mesh that forms a mesh shield mat layer. For example, FIG. 12 illustrates one implementation of a knitted metallic mesh layer in which metallic threads 71 are knitted together in a weft knit pattern and are disposed on a backing layer 76 to form a mesh shield mat layer 70. FIG. 13 illustrates another implementation of a knitted metallic mesh layer in which metallic threads 81 are knitted together in a warp knit pattern and are disposed on backing layer 86 to form a mesh shield mat layer 80. The knit patterns shown in FIGS. 12 and 13 allow the mesh shield mat layers 70, 80 to maintain contact when stretched, which maintains electrical conductivity through the mesh layer 70, 80 after the layer 70, 80 is secured to the steering wheel rim. These knit patterns are exemplary, and other suitable knit patterns may be used in other implementations.

In the exemplary layers 70, 80 shown in FIGS. 12 and 13, the spacing between adjacent courses and wales is between about 1 mil and about 4 mils. In certain implementations, the spacing of adjacent courses and wales is about 2 mils. For example, the mesh may include 25 to 29 courses per inch of length and have 14 to 15 openings per inch of width. In addition, the threads may comprise any suitable conductive materials, such as MONEL or copper, for example. In one implementation, the threads are MONEL 400 wire.

Furthermore, the diameter of the threads may be selected to provide a thickness of the mesh of between about 0.002 and about 0.005 inches thick, according to some implementations. For example, the diameter of the threads may be around 0.0035 inches. The knitted meshes shown in FIGS. 12 and 13 are not coated with a dielectric material, but in other implementations, the knitted mesh may be coated with a suitable dielectric material.

The backing layers 76, 86 may include a foam material, for example, or other suitable material. The thickness of the backing layer 76, 86 may be between about 1 mil and about 4 mils thick. For example, the backing layer 76, 86 in certain implementations is about 2 mils thick.

In some implementations, the knitted mesh may be adhered to the backing layer 76, 86, for example, using acrylic dispersion type adhesives or any other suitable type of adhesive. Alternatively (not shown), the knitted mesh may be sewn onto the backing layer 76, 86 or attached using any suitable fastening mechanism.

The knitted mesh can stretch about 10% to about 15% along axis A-A or axis B-B without interfering with the conductive properties of the knitted mesh, according to certain implementations. For the implementation shown in FIG. 12, axis A-A extends parallel to long edges 77 of the backing layer 76, and axis B-B extends perpendicularly to axis A-A and parallel to short edges 78 of the backing layer 76. The knitted metallic mesh is disposed on the backing layer 76 such that the A-A axis extends through an uppermost point 91 of a first loop L1 in a first course C1 and a first wale W1 and an uppermost point 92 of a second loop L2 in a second course C2 and a second wale W2, wherein the first course C1 is below and adjacent to the second course C2 and the first wale W1 is to the left of and adjacent the second wale W2. Axis B-B extends through the uppermost point 92 of the second loop L2 in the second course C2 and an uppermost point 93 of a third loop L3 in the first wale W1 and a third course C3 that is above and adjacent to the second course C2.

Similarly, in the implementation shown in FIG. 13, the mesh is oriented such that axis A-A extends through a lower right contact point 95 and an upper left contact point 96 formed by overlapping threads in C1, W1. Axis B-B extends through a lower left contact point 97 and an upper right contact point 98 formed by overlapping threads C1, W1.

During installation of the mesh shield mat layer 70, 80 on the steering wheel rim, the shield mat layer 70, 80 is stretched along the A-A axis and the B-B axis. This arrangement of the mesh layer improves contact between the adjacent loops.

Other implementations (not shown) may include a mesh shield mat layer that includes metal strips that are welded together to form the mesh material. In certain implementations, the metal strips may be coated with a dielectric material. The welded mesh may have a stretchability that is between about 5% and about 10%, according to some implementations.

In certain implementations, the mesh shield mat layer 70, 80 may include one mesh layer area that provides one conductive zone adjacent the mesh layer area. However, in other implementations (not shown), the mesh shield mat layer 70, 80 may comprise a plurality of separate mesh layer areas that are spaced apart and separated from each other on the backing layer 76, 86 but are electrically coupled together to provide one conductive zone adjacent each of the plurality of mesh layer areas. Such an implementation provides targeted shielding to a particular area of the steering wheel and reduces the amount of mesh layer used for the mesh shield mat layer 70, 80. In another implementation (not shown), the plurality of separate mesh layer areas may not be electrically coupled and are instead coupled separately to the power source to provide separate conductive zones that can be activated separately.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. While implementations will be described for steering wheel hand detection systems, it will become evident to those skilled in the art that the implementations are not limited thereto.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

References herein to the positions of elements (e.g., "top," "bottom," "above," "below," etc.) are merely used to describe the orientation of various elements in the FIGURES. It should be noted that the orientation of various elements may differ according to other exemplary embodiments, and that such variations are intended to be encompassed by the present disclosure.

It is important to note that the construction and arrangement of the sensing system for a steering wheel as shown in the various exemplary embodiments is illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting or layering arrangements, use of materials, colors, orientations, etc.) without materially departing from the novel teachings and advantages of the subject matter described herein. For example, elements shown as integrally formed may be constructed of multiple parts or elements, the position of elements may be reversed or otherwise varied, and the nature or number of discrete elements or positions may be altered or varied. The order or sequence of any process or method steps may be varied or re-sequenced according to alternative embodiments. Other substitutions, modifications, changes and omissions may also be made in the design, operating conditions and arrangement of the various exemplary embodiments without departing from the scope of the present embodiments.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A system for shielding a hand sensor system in a steering wheel comprising:
 a power source in communication with the hand sensor system;
 a sensor mat comprising one or more capacitive sensing loops having respectively separate connections to the power source wherein each of the sensing loops receives, from the power source, a respective sensing voltage signal that defines a respective sensing zone in the sensor mat, and wherein the sensor mat transmits at least one presence signal from at least one of the sensor loops back to the power source to indicate a presence of an input in at least one of the sensing zones;

a heater mat disposed between a steering wheel frame and the sensor mat, the heater mat comprising one or more heating conductive loops connected to the power source, wherein the power source transmits a heating current to at least one of the heating conductive loops upon receiving the presence signal;

a shielding mat positioned between the heater mat and the sensor mat, the shielding mat comprising one or more shielding conductive loops having respectively separate connections to the power source wherein each of the shielding conductive loops receives a discrete shielding voltage signal from the power source, wherein the shielding conductive loops define respective shielding zones in the shielding mat, wherein at least one of the sensing zones and at least one of the shielding zones occupy corresponding positions along the steering wheel, and the shielding zones shield the sensing zones from interference.

2. The system of claim 1 wherein the power source is further configured for generating the shielding voltage signal in response to receiving an override signal from another vehicle system in communication with the power source and indicating that sensing takes priority over heating.

3. The system of claim 1, wherein the power source alternately generates the heating current and the shielding voltage signal periodically.

4. The system of claim 3, wherein the power source is configured for alternately generating the heating current for about 10 to about 50 milliseconds and the shielding voltage signal for about 10 to about 50 milliseconds.

5. The system of claim 1, wherein the heating current is between about 4 amperes and about 8 amperes.

6. The system of claim 1, wherein the shielding voltage signal generates a shielding current on at least one of the shielding conductive loops that is less than about 200 microamperes.

7. The system of claim 1, further comprising one or more sensor return wires extending out of the sensor mat and connecting the sensor loops to the power source and a metallic shield disposed around at least a portion of the sensor return wires, the metallic shield configured for substantially isolating the generated signal on the respective sensor return wires from another conductive element adjacent the sensor return wire.

8. The system of claim 7, wherein:
the one or more sensing loops comprise a first sensing loop and a second sensing loop within the sensor mat;
a first sensor return wire extends out of the sensor mat and from the first sensing loop and a second sensor return wire extends out of the sensor mat and from the second sensing loop and a portion of the second sensor return wire crosses over the sensor mat and adjacent the first sensing loop; and
the metallic shield extends around at least the portion of the second sensor return wire that crosses over the first sensing loop.

9. The system of claim 8, wherein the metallic shield extends around substantially all of the second sensor return wire that extends from the second sensing loop.

10. A system for shielding a hand sensor system in a steering wheel comprising:
an electronic control unit comprising a processor and a power source, wherein the electronic control unit accesses previously input shielding current values and heating current values for use by the processor in controlling the power source;

a sensor mat comprising one or more capacitive sensing loops connected to the electronic control unit with respectively separate sensor return wires and each of the sensing loops defining a sensing zone of the steering wheel upon receiving a sensing voltage signal from the power source;

a heater mat disposed between a steering wheel frame and the sensor mat, the heater mat comprising one or more heating conductive loops connected to the electronic control unit, wherein the processor instructs the power source to transmit a heating current, corresponding to the previously input heating current values, to at least one of the heating conductive loops upon receiving the presence signal; and a shielding mat positioned between the heater mat and the sensor mat, the shielding mat comprising one or more shielding conductive loops connected to the electronic control unit by respectively separate conductive feed shielding wires, wherein the processor instructs the power source to transmit a shielding current, corresponding to the previously input shielding current values, to at least one of the shielding conductive loops such that the at least one of the shielding conductive loops defines a respective shielding zone in the shielding mat, wherein the sensing zones and the shielding zones occupy corresponding positions along the steering wheel, and the shielding zones shield the sensing zones from interference.

11. The system of claim 10, wherein the shielding electrical current is less than about 200 microamperes.

12. The system of claim 11, wherein the shielding electrical current is about 10 microamperes.

13. The system of claim 10, wherein the heating current generated is between about 4 amperes and about 8 amperes.

14. The system of claim 13, wherein the heating current is about 7 amperes.

15. The system of claim 1, wherein the power source is configured for generating the heating current for at least one of the one or more heating conductive loops of the heater mat in response to receiving an on signal for the heater mat.

16. The system of claim 1, wherein the shielding mat is directly adjacent the sensor mat.

17. The system of claim 1, further comprising an outer skin surrounding the sensor mat and under tension that squeezes the sensor mat and the shielding mat together.

18. The system of claim 1, wherein respective sensor voltage signals and shielding voltage signals are substantially matching signals.

19. The system of claim 1, wherein the electronic control unit is configured to generate the heating current for a selected heating conductive loop positioned adjacently a corresponding pair of a particular shielding conductive loop and a particular sensing loop when the particular sensing loop indicates that an input is sensed in the selected sensing zone.

20. A system for shielding a hand sensor system in a steering wheel comprising:
an electronic control unit comprising a power source and a processor accessing instructions in the electronic control unit, wherein the instructions allow the processor to determine an output from the power source;
a sensor mat comprising one or more capacitive sensing loops connected to the electronic control unit, wherein each of the sensing loops defines a respective sensing zone in the sensor mat, wherein each sensing loop is separately controlled by the power source;

a heater mat disposed between a steering wheel frame and the sensor mat, the heater mat comprising one or more heating conductive loops connected to the electronic control unit;

a shielding mat positioned between the heater mat and the sensor mat, the shielding mat comprising one or more shielding conductive loops connected to the electronic control unit by respective insulated shielding return wires extending from the shielding mat, wherein the shielding conductive loops define respective shielding zones in the shielding mat, wherein at least one of the sensing zones and at least one of the shielding zones occupy corresponding positions along the steering wheel, and the shielding zones shield the sensing zones from interference;

wherein the power source is configured by the instructions in the electronic control unit for selectively generating the output for an electrical heating current on the heating conductive loops, and to apply respective sensor voltage signals and shielding voltage signals on the sensor loops and the shielding conductive loops;

wherein the sensor loops transmit a generated signal from the sensor loops to the electronic control unit to indicate a presence of an input in the sensing zone.

21. The system according to claim 20, further comprising:
one or more sensor return wires extending out of the sensor mat and connecting the sensor loops to the electronic control unit and a metallic shield disposed around at least a portion of one or more the sensor return wires connected to the sensor mat, the metallic shield configured for substantially isolating the generated signal on the respective sensor return wires from another conductive element adjacent the sensor return wire,
wherein the insulated shielding return wire is connected to the metallic shield.

22. The system according to claim 21, wherein the metallic shield comprises a backing layer between an exposed outer surface of the metallic shield and the sensor return wire.

23. The system according to claim 22, wherein the backing layer comprises a foam material.

24. The system according to claim 22, wherein the backing layer is between about 1 mil and about 4 mils thick.

25. The system of claim 20 wherein the power source is further configured for generating the shielding voltage signal in response to receiving an override signal indicating that sensing takes priority over heating.

26. The system of claim 20 wherein the power source is further configured for generating the shielding voltage signal in response to a temperature of the sensor mat reaching a set temperature.

27. The system of claim 20 wherein the power source is configured for alternately generating the heating current for about 10 to about 50 milliseconds and the shielding voltage signal for about 10 to about 50 milliseconds.

28. The system of claim 20 wherein the heating current is between about 4 amperes and about 8 amperes.

29. The system of claim 20 wherein the shielding voltage signal generates a shielding current on the shielding conductive loop that is less than about 200 microamperes.

30. The system of claim 20 wherein the power source is configured for generating the heating current for at least one of the one or more heating conductive loops of the heater mat in response to receiving an on signal for the heater mat.

31. The system of claim 20, further comprising an outer skin surrounding the sensor mat and under tension that squeezes the sensor mat and the shielding mat together.

32. The system of claim 20 further comprising heating conductive feed lines connecting the electronic control unit to the heating conductive loops and shielding conductive feed lines connecting the shielding conductive loops to the electronic control unit.

33. The system of claim 20, wherein the electronic control unit is configured to generate the heating current for a selected heating conductive loop positioned adjacently a corresponding pair of a particular shielding conductive loop and a particular sensing loop when the particular sensing loop indicates that an input is sensed in a selected sensing zone.

* * * * *